(12) United States Patent
Kirchdoerffer

(10) Patent No.: US 8,917,089 B2
(45) Date of Patent: Dec. 23, 2014

(54) DEVICE FOR DETECTING AND COUNTING METAL ELEMENTS

(75) Inventor: Rémy Kirchdoerffer, Grancy (CH)

(73) Assignee: Senstronic (Societe par Actions Simplifiee), Saverne (FR)

( * ) Notice: Subject to any disclaimer, the term of this patent is extended or adjusted under 35 U.S.C. 154(b) by 0 days.

(21) Appl. No.: 13/695,816

(22) PCT Filed: May 10, 2011

(86) PCT No.: PCT/FR2011/051044
§ 371 (c)(1),
(2), (4) Date: Nov. 20, 2012

(87) PCT Pub. No.: WO2011/141672
PCT Pub. Date: Nov. 17, 2011

(65) Prior Publication Data
US 2013/0064635 A1 Mar. 14, 2013

(30) Foreign Application Priority Data
May 12, 2010 (FR) ...................................... 10 53729

(51) Int. Cl.
G01B 7/06 (2006.01)
G01B 7/14 (2006.01)
G01R 27/04 (2006.01)
G01R 27/08 (2006.01)
G01R 33/00 (2006.01)
G01V 3/10 (2006.01)
B25J 15/06 (2006.01)

(52) U.S. Cl.
CPC ................ *G01R 33/00* (2013.01); *G01V 3/105* (2013.01); *B25J 15/0608* (2013.01); *B25J 15/0616* (2013.01)
USPC ...... 324/229; 324/207.26; 324/635; 324/644; 324/699; 324/230

(58) Field of Classification Search
CPC .... G01R 33/00; B25J 15/0616; B25J 15/0608
USPC .......... 324/229, 230, 207.26, 207.15–207.19, 324/76.75, 635, 644, 699
See application file for complete search history.

(56) References Cited

U.S. PATENT DOCUMENTS 3,165,726 A * 1/1965 Riley et al. .................... 340/674
4,881,031 A * 11/1989 Pfisterer et al. ................ 324/233
5,623,427 A * 4/1997 Vandervalk et al. .......... 702/170

(Continued)

FOREIGN PATENT DOCUMENTS

DE  34 25 354 A1  1/1986
DE  35 05 671 A1  8/1986
DE  298 08 830 U1  8/1998

OTHER PUBLICATIONS

International Search Report, dated Sep. 27, 2011, from corresponding PCT application.

*Primary Examiner* — Patrick Assouad
*Assistant Examiner* — Hoang X Nguyen
(74) *Attorney, Agent, or Firm* — Young & Thompson

(57) ABSTRACT

A device for detecting metal elements in slab form such as metal plates or sheets, includes an emission coil powered by suitable control elements and generating a magnetic field, a reception coil placed so as to enable generation via induction of a voltage across the terminals of the coil under the action of the magnetic field, and elements for processing and evaluating the voltage signal delivered by the at least one reception coil, enabling delivery of an information signal indicating the absence or presence of one or more metal elements near the coils. The emission coil (3) and the reception coil (5) are both mounted in a housing or a sensor head having an active detection face having an associated detection region, and are positioned at a defined inclination one relative to the other and relative to the face.

16 Claims, 4 Drawing Sheets

(56) References Cited

U.S. PATENT DOCUMENTS

| | | |
|---|---|---|
| 5,760,577 A * | 6/1998 | Shizuya .................. 324/207.16 |
| 6,288,536 B1 * | 9/2001 | Mandl et al. .................. 324/225 |
| 2001/0020846 A1 | 9/2001 | Miyata |
| 2003/0071708 A1 * | 4/2003 | Schmidt ........................ 336/220 |
| 2004/0056652 A1 * | 3/2004 | Bomya .................... 324/207.17 |
| 2005/0212510 A1 * | 9/2005 | Kirchdoerffer et al. . 324/207.15 |
| 2007/0140823 A1 * | 6/2007 | Dorner et al. ................. 414/685 |
| 2007/0251311 A1 * | 11/2007 | Schoen ........................... 73/159 |

\* cited by examiner

DEVICE FOR DETECTING AND COUNTING METAL ELEMENTS

BACKGROUND OF THE INVENTION

1. Field of the Invention

This invention relates to the field of detecting the presence or proximity of metal elements, objects or articles, more particularly ferromagnetic materials, and more specifically in an industrial environment.

The invention has more particularly as its object a device for detecting metal plate elements, more particularly a so-called double sheet detection device, as well as a system for selecting and transferring such elements.

2. Description of the Related Art

During the production of sheet metal parts, the latter are brought near the station for cutting, stamping, folding or the like, in the form of stacked flat elements.

They must then be selected one at a time to be brought toward or into the processing station, or onto a conveyor belt of such a station.

At this time, it should be guaranteed that the sheets are brought individually to prevent any malfunctioning or stopping of the processing station that can be caused by the simultaneous processing of two or more stacked sheets.

To remove this risk, various devices for detecting metal plate elements, such as metal sheets or plates, intended in particular to work with or to be incorporated into a system for selection, movement, transfer and/or positioning or the like of such elements, have already been proposed.

Thus, by the document DE 3505671, a device for measuring the thickness of a sheet by determining the change in the inductance of an electromagnet is known, and by the document DE 3425354, a device for measuring the thickness of a sheet by using Foucault currents is known, by determining a differential voltage between the voltage recovered at the terminals of a detection coil and a reference voltage.

The processes used in these documents are complex and are based on the evaluation and the interpretation of the value of an absolute analog measurement, whence uncertain reliability results. Moreover, no constructive embodiment of a material device is disclosed by these documents.

By the document DE 298 08 830, a device to mark metal parts is known, this device comprising emission and reception coils that can be positioned between one another according to different configurations.

By the document US 2001/0020846, a position sensor to determine the location of a metal element in relation to a group of emission and reception coils that are inclined in relation to one another is known.

However, neither of these two known devices uses the amplitude of the signal collected, nor all the more makes it possible to determine the number of detected parts or elements.

Moreover, so-called "double sheet" detection devices are known that each consist mainly, on the one hand, of an emitting coil supplied by suitable control means and generating a magnetic field; on the other hand, of a reception or receiving coil placed so as to make possible the generation by induction of a voltage at the terminals of said coil under the action of the aforementioned magnetic field, and, finally, of means for processing and evaluating the voltage signal provided by said at least one reception coil, making it possible to provide an informative signal indicating the absence or the presence of one or more metal elements in the vicinity of said coils.

In these double sheet detectors that are known and used in particular within the framework of automobile construction, the sheet or the edge of the sheet must necessarily be put through the gap between the two coils, the latter being placed opposite.

This constraint slows down the movement of the manipulated sheets and necessitates a precise positioning, with a movement along an additional path, indeed a specific monitoring station at the level of the supply means of the station or of the machine for processing said sheets.

Furthermore, these known double sheet detectors with opposite coils exhibit a considerable bulk.

BRIEF SUMMARY OF THE INVENTION

This invention has as its object to mitigate the above-mentioned drawbacks.

For this purpose, the invention has as its object a device for detecting metal plate elements such as metal sheets or plates, intended in particular to work with or to be incorporated into a system for selection, movement, transfer and/or positioning or the like of such elements, a device consisting mainly, on the one hand, of an emission or emitting coil supplied by suitable control means and generating a magnetic field; on the other hand, of a reception or receiving coil placed so as to make possible the generation by induction of a voltage at the terminals of said coil under the action of the aforementioned magnetic field, and, finally, of means for processing and evaluating the voltage signal provided by said at least one reception coil, making it possible to provide an informative signal indicating the absence or the presence of one or more metal elements in the vicinity of said coils, these coils being positioned with a specific inclination in relation to one another, in such a way that the magnetic coupling between the two coils is changed by the presence of one or more nearby metal elements, a device characterized in that the emission coil and the reception coil are both mounted in a case or a sensor head having an active detection face with a corresponding detection area, and are positioned with a specific inclination and in relation to said face, and in that the magnitude of the change in the amplitude and/or in the power of the voltage signal at the terminals of the reception coil due to the presence of one or more metal elements near said active face is picked up and used by the processing and evaluation means to determine the number of metal plate elements present.

Thanks to these arrangements, it is no longer necessary to make the sheets or the edges of the sheets pass between the two emitting and receiving coils, a simple passage of their edges near the active face of the sensor that is part of the detection device, in the detection area, being sufficient. Such a momentary positioning of the sheets can easily be incorporated into an overall displacement movement of said sheets, possibly without modifying the path, with possibly only a slight offsetting or delay in the execution of said movement. Moreover, the manner in which the elements are brought and the course taken by these elements are immaterial.

The invention is essentially based on the surprising finding of the inventor that, for the simple sheet/multiple sheets discrimination, the presence of a peripheral part or of the edge of the sheets in the detection area was sufficient to lead to a reliable result, considering also the discrete nature of the use of the signal picked up (determination of a number of present, a priori similar, units).

Mutual inclined positioning of the coils, in this document, means a relative mutual positioning, such that the axes of symmetry or central axes $XE$ and $XR$ of the emission and reception coils, preferentially coplanar axes, are secant and form between them an angle theoretically between 0° (parallel axes) and 180° (merged axes—coils opposite one another), customarily between approximately 45° and approximately 135°, preferentially between approximately 75° and 105°.

Furthermore, the coils are placed relatively close to one another in such a way that in the absence of a metal element in the detection area, and considering the relative mutual orientation of said coils, a sufficient electromagnetic coupling exists between them to provide a receiving signal whose variations are significant and usable in the presence of metal element(s).

Preferentially, the emission and reception coils are arranged according to a configuration such that, seen in section along a plane containing their respective axes of symmetry, they form with the active detection face approximately a right triangle, whose said active face constitutes the hypotenuse.

Furthermore, the device according to the invention can also exhibit one or more of the following characteristics or constructive variants:

- the emission and reception coils can be arranged in the immediate proximity of one another in such a way that, even in the absence of a metal element in the detection area, a sufficient electromagnetic coupling exists between them to provide a receiving signal whose variations are significant and usable in the presence of one or more metal elements, even when only a peripheral part or an edge of said element(s) is present in the detection area;
- the emission and reception coils can be mounted in or on a support body, ensuring their inclined positioning in relation to one another, for example approximately perpendicular in relation to one another, said support body defining, if necessary, also materially the active detection face;
- the emission coil can consist of two elementary coils that are placed side by side and coaxial, active in an alternating manner;
- the emission and reception coils can be housed in a sensor head that is part of a sensor whose case contains at least a part of the control means and of the processing and evaluation means;
- the control means can supply the emission coil with a specific frequency signal (fosc), adapted to the material constituting the metal plate elements to be detected;
- a capacitor of capacitance $C_R$ can be mounted in parallel with the reception coil of inductance $L_R$, $C_R$ and $L_R$ being such that:

$$L_R \times C_R \times (2\Pi \times fosc)^2 = 1;$$

- the processing and evaluation means can comprise means for filtering, preferentially of the band-pass type, and optionally for amplification of the AC voltage recovered at the terminals of the reception coil, means for demodulating the filtered and amplified signal, means for analog/digital conversion that process the amplitude of the demodulated signal and, if necessary, for comparison of the value of the demodulated and converted signal with a predefined, pre-entered or communicated reference value, for example corresponding to the presence of a single metal plate element in the detection area associated with the active face of the sensor;
- the processing and evaluation means can comprise a circuit able to deliver a pace or timing signal to the control means of the emitting coil, so as to synchronize the excitation of the latter with the acquisition of the receiving signal, and/or
- a ferrite-forming part can be associated with the emitting coil and/or with the receiving coil.

The invention also relates to a system for selecting and transferring metal plate elements, stacked in piles, said system comprising at least one manipulating element, for example of the robot arm type equipped with suction cups or with a means for magnetic seizing, selecting said elements one by one and moving them along a specific path, a system characterized in that it also comprises a detection device as described above, installed in such a way that during the movement of a metal element selected by the manipulation element, at least one of the lateral edges of the metal element is positioned in the detection area associated with the active face of the case or of the sensor head of said detection device.

BRIEF DESCRIPTION OF THE DRAWINGS

The invention will be better understood, thanks to the description below, which relates to preferred embodiments, given by way of nonlimiting examples, and explained with reference to the accompanying diagrammatic drawings, in which.

DETAILED DESCRIPTION OF THE PREFERRED EMBODIMENTS

Figure 1:
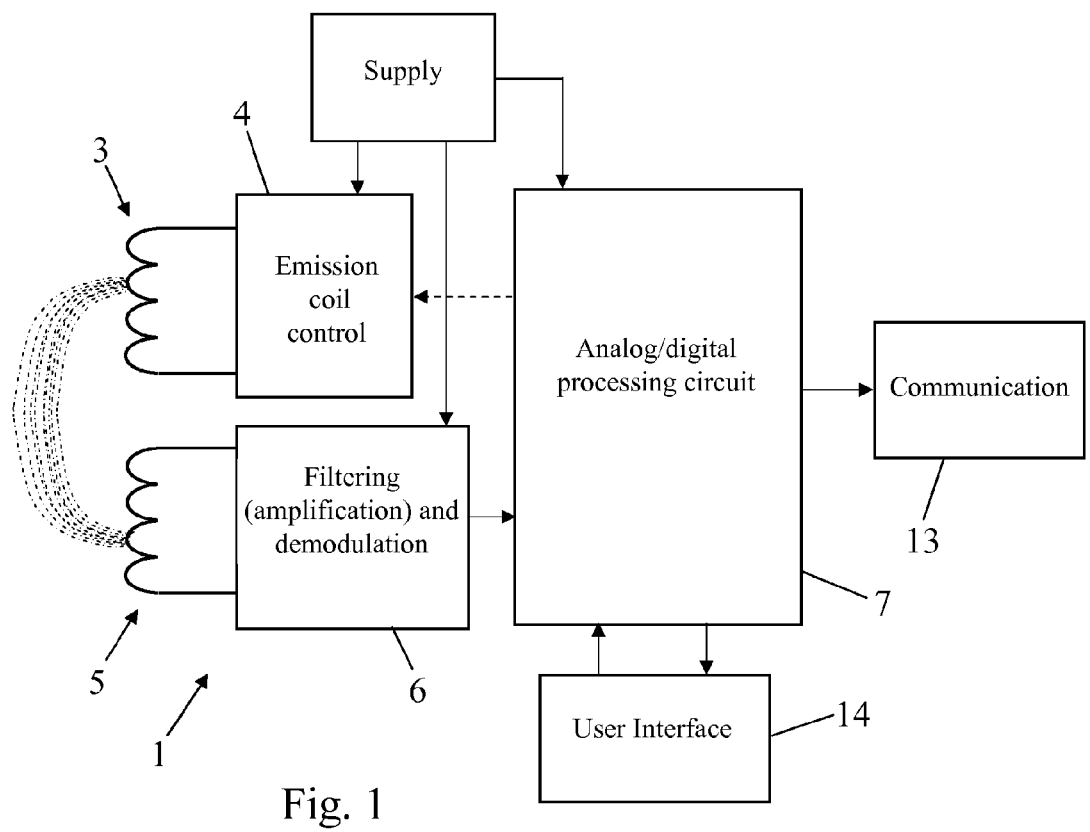
FIG. 1 is a block diagram of a detection device according to the invention, no metal plate element being present in the detection area.
Figure 2A:
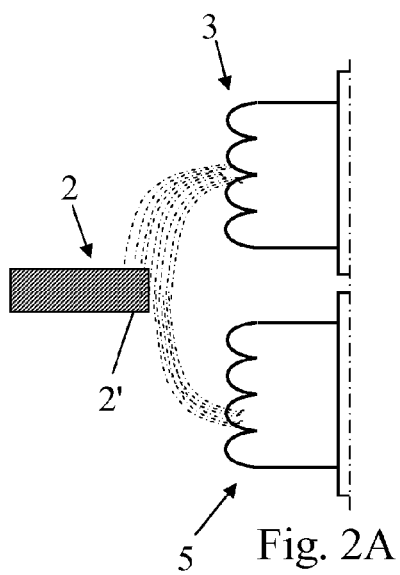
FIGS. 2A and 2B are diagrammatic detail views illustrating the modification of the configuration of the field lines and of the electromagnetic coupling in the presence of one sheet (FIG. 2A) and two sheets (FIG. 2B)
Figure 2B:
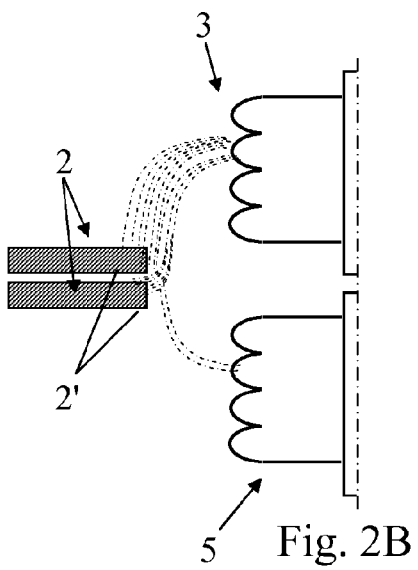

FIG. 1 and partially FIG. 3 illustrate a device 1 for detecting metal plate elements 2 such as metal sheets or plates, intended in particular to work with or to be incorporated into a system for selecting, moving, transferring and/or positioning or the like of such elements.

This device 1 consists mainly, on the one hand, of an emission or emitting coil 3 supplied by suitable control means 4 and generating a magnetic field; on the other hand, of a reception or receiving coil 5 placed so as to make possible the generation by induction of a voltage at the terminals of said coil 5 under the action of the aforementioned magnetic field, and, finally, of means 6, 7 for processing and evaluating the voltage signal provided by said at least one reception coil 5, making it possible to provide an informative signal indicating the absence or the presence of one or more metal elements 2 in the vicinity of said coils 3, 5.

These coils 3, 5 are positioned with a specific inclination in relation to one another, in such a way that the magnetic coupling between the two coils (3 and 5) is changed by the presence of one or more nearby metal elements (2).

According to the invention, the emission coil 3 and the reception coil 5 are both mounted in a case or a sensor head 8 having an active detection face 9 with a corresponding detection area 9', and are positioned with a specific inclination and in relation to said face 9, and in that the magnitude of the change in the amplitude and/or in the power of the voltage signal at the terminals of the reception coil 5 due to the presence of one or more metal elements 2 near said active face 9 is picked up and used by the processing and evaluation means 6, 7 to determine the number of metal plate elements 2 present.

Preferentially, the emission and reception coils 3 and 5 are arranged according to a configuration such that, seen in section along a plane containing their respective axes of symmetry (XE and XR), they form with the active detection face 9 approximately a right triangle, whose said active face 9 constitutes the hypotenuse.

Figure 3A:
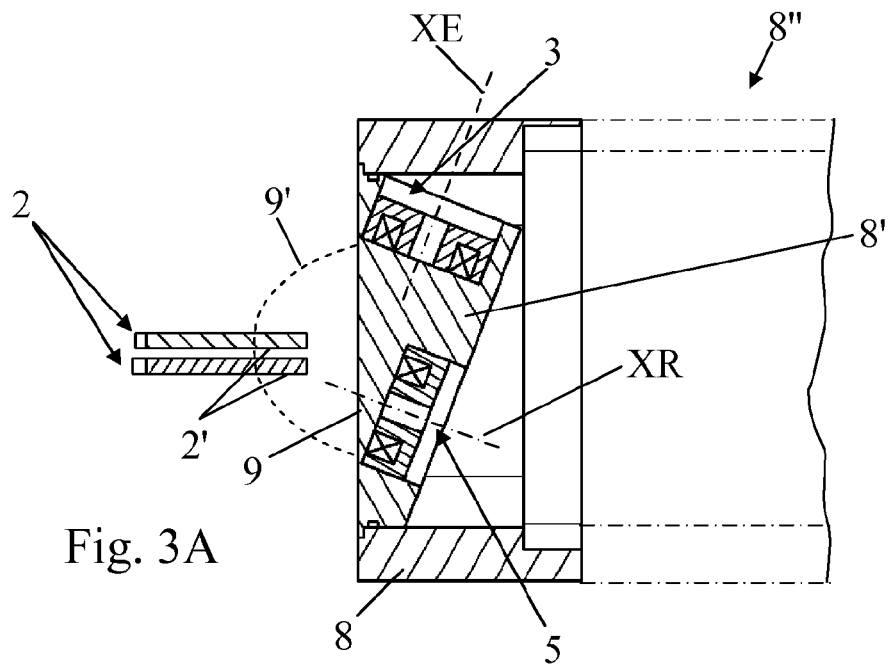
FIGS. 3A and 3B are cutaway views illustrating an arrangement of coils in a sensor head that is part of practical embodiments of the device according to the invention.
Figure 3B:
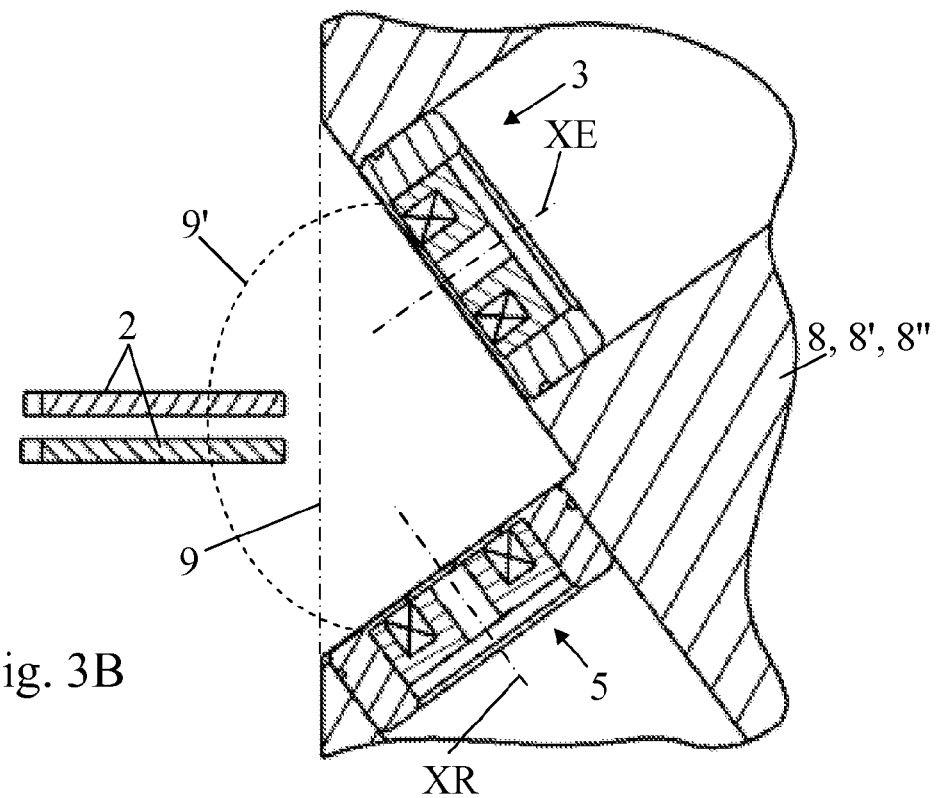

As FIGS. 3A and 3B show and in a practical manner, the emission coil 3 and reception coil 5 are mounted in or on a support body 8', ensuring their inclined positioning in relation to one another, for example approximately perpendicular in relation to one another, said support body 8' defining, if necessary, also materially the active detection face 9.

The active detection face 9, generally considered as being a flat surface, can be merged completely with the approximately flat material face of the sensor head 8 or of the sensor case 8", providing or containing the support body 8', as FIG. 3A shows.

The material configuration of the support body 8' and/or of the head 8 or of the case 8" of the sensor can also be non-flat, for example recessed (FIG. 3B), with the coils 3 and 5 being optionally positioned in a flush manner in a recess or a cavity similar to the face of the sensor concerned.

In this latter case, the support body 8' can, if necessary, be made of a metal material, and optionally be made in a single-piece way with the case and/or the sensor head. The coils 3 and 5 can then be positioned (with their plastic wrapping) in openings made in this body 8' (FIG. 3B).

The inventor has found that with the device 1 according to the invention, the variation in the amplitude of the signal picked up at the level of the reception coil 5 is not very dependent on the thickness of the plate element 2 presented at the level of the active face 9.

On the contrary, the variation of the signal found at the level of the reception coil 5 is significant, as soon as several plate elements 2, such as sheets (even stacked), are presented near the active face 9 and whether the edges 2' of the sheets are aligned or not. In fact, it has been found that a margin of a few millimeters in back or in front is allowed by the device 1 which continues despite that to detect correctly the presence of several sheets 2.

The mode of operation of the device 1 according to the invention is described more in detail below, in connection with the accompanying figures and on the basis of different variant embodiments of certain parts of said device 1.

A magnetic field is produced by the emission coil 3 that is excited in a suitable manner (a ferrite can be used to concentrate the field lines produced by the emission coil).

This emission coil 3 is controlled by suitable means 4 comprising switches and/or amplifiers, configured to supply said emission coil 3 with a frequency fosc (several configurations are possible: H Bridge, . . . ).

If necessary, the above-mentioned switches can be directly controlled at the frequency fosc by the circuit 7 for analog/digital processing (of the micro-controller type, ASIC, DSP or the like), thus making it possible to synchronize the acquisition (sampling) of the receiving signal with the sending of pulses from the emission coil 3 (synchronous detection).

Nevertheless, in a variant, the switches can be controlled via a circuit that is independent of the circuit 7 for analog/digital processing (for example, an impulse generator), which oscillates at the selected frequency fosc. The synchronous detection is in fact not essential for detecting in a reliable way by the device 1.

The alternative component of the magnetic field produced by the emission coil 3 induces an AC voltage in the reception coil 5.

A frequency fosc of approximately 2 kHz is well suited to the detection of sheets of steel, but other frequencies can be selected to initiate the detection of other materials.

The amplitude of the AC voltage present at the terminals of the reception coil 5 is a function:
  of the amplitude of supply voltage of the emission coil 3;
  of the impedance of the circuit to which the reception coil 5 is connected;
  of the metal environment that is near to the coils 3 and 5.

It should be noted that a ferrite can be used to concentrate the field lines picked up by the reception coil 5.

To obtain an easily usable signal and with maximum amplitude, it is preferable to connect a capacitor $C_R$ in parallel to the reception coil 5 with inductance $L_R$ so that the criteria: $L_R \times C_R \times (2\Pi \times fosc)^2 = 1$ is respected.

The AC voltage recovered at the terminals of the reception coil 5 is then processed by suitable means 6 to be filtered and amplified (preferably using a band-pass filter to eliminate the spurious frequencies of the mains frequency type and/or RF interferences), and then demodulated to be able to use the amplitude of the receiving signal via the circuit 7 for analog/digital conversion and processing.

As a function of the nature of the metal environment (presence of sheets 2 or of any other metal object), the signal picked up at the terminals of the reception coil 5 is going to be more or less attenuated.

Thus, in the presence of the edge 2' of a sheet 2 (or of several sheets, flattened or not on one another), the signal detected by the reception circuit and coil is attenuated.

As previously indicated, the attenuation of the receiving signal depends very little on the thickness of sheet(s) 2 presented and depends mainly, indeed exclusively, on the number of sheets 2 detected.

In fact, because the magnetic field lines that run along the sheets 2 produce induced currents in these sheets 2, each sheet 2 becomes a power consumer and consequently constitutes a receiver that "competes with" the reception coil 5.

The presence of several sheets 2 is thus equivalent to the putting in parallel of several power consuming circuits.

Thus, the more sheets 2 there are presented near (detection area 9') the pair of emission/reception coils 3 and 5, the more the electromagnetic coupling that links the emission coil 3 to the reception coil 5 will be weak and, thereby, the more the signal detected by the reception coil 5 will be attenuated.

In the case of several sheets, the inventors have been able to note that the fact that the latter are or are not flattened against one another, or that the latter are or are not offset (by a few millimeters) in relation to one another, does not at all change the ability of the device 1 to detect the presence of several sheets 2 of the same material, whether their thicknesses are identical or not.

By comparing the level of the receiving signal in a reference environment (presence of a single sheet 2, for example), a reference level is defined (by the analog/digital processing circuit 7).

This reference level is then compared to any other level linked to the presence or not of sheets.

It thus becomes possible to compare the level of the receiving signal measured at the reference level and to warn, by a communication circuit or element 13, for example, of the presence of several sheets.

The reference level can be defined during manufacturing or via the user (by a user interface 14) or by any other means of communication if the device 1 is equipped with it.

Figure 4:
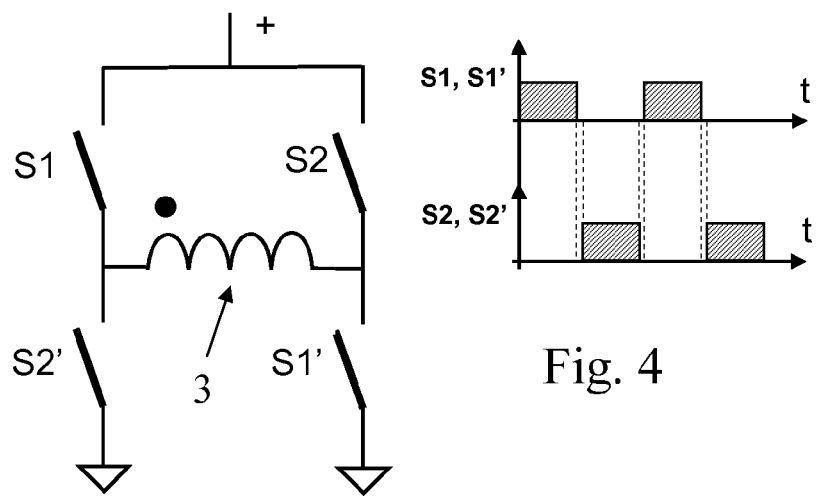
FIGS. 4 to 6 are diagrammatic representations of three variant embodiments of control means of an emitting coil that is part of the device according to the invention, as well as the associated control signals or timing diagrams, and, FIG. 7 is a diagrammatic representation of an embodiment of filtering and pre-processing means that are part of the device according to the invention.
Figure 5:
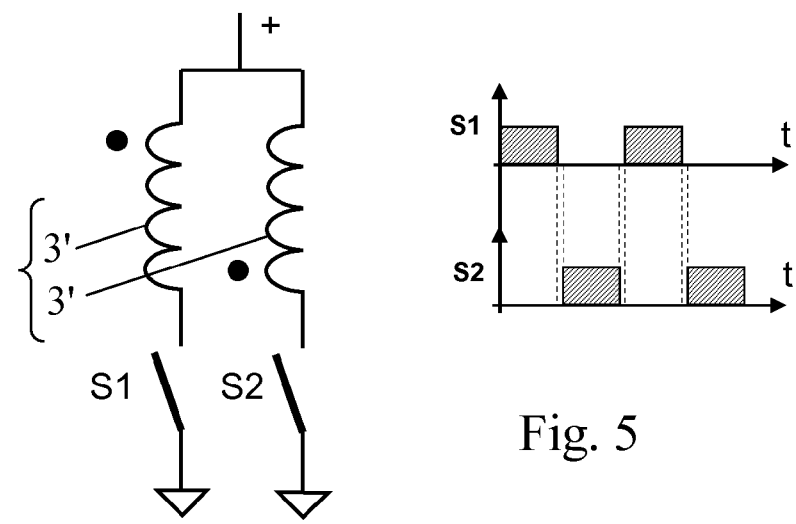
Figure 6:
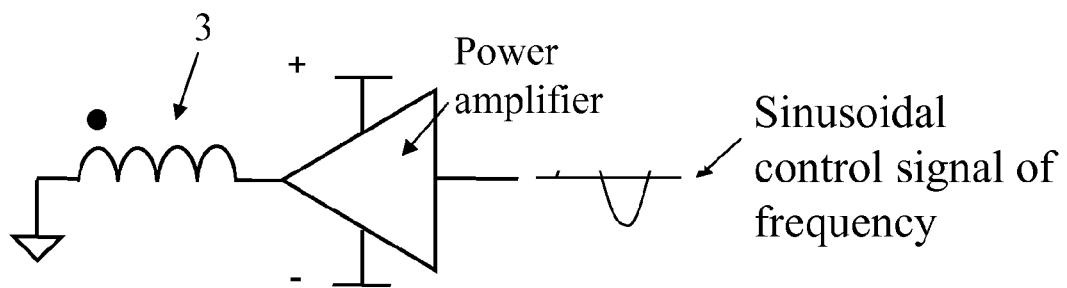

FIGS. 4 to 6 illustrate different variant embodiments of the control circuit 4, as well as the timing diagrams of the respectively associated actuating signals.

As FIGS. 4 and 5 show, a "square" signal of period 1/fosc can be applied to the emission coil 3 (with or without pulse width modulation), for example by switches S1, S2, S1' and S2' of an H bridge (FIG. 4), or else by a structure (FIG. 5), which minimizes the number of electronic switches because of the use of two emission coils 3' each acted on over a half-period by associated switches S1 and S2.

As a variant, and as FIG. 6 shows, the control circuit 4 can also apply a sinusoidal signal of frequency fosc to the emission coil 3, optionally after amplification.

Figure 7:
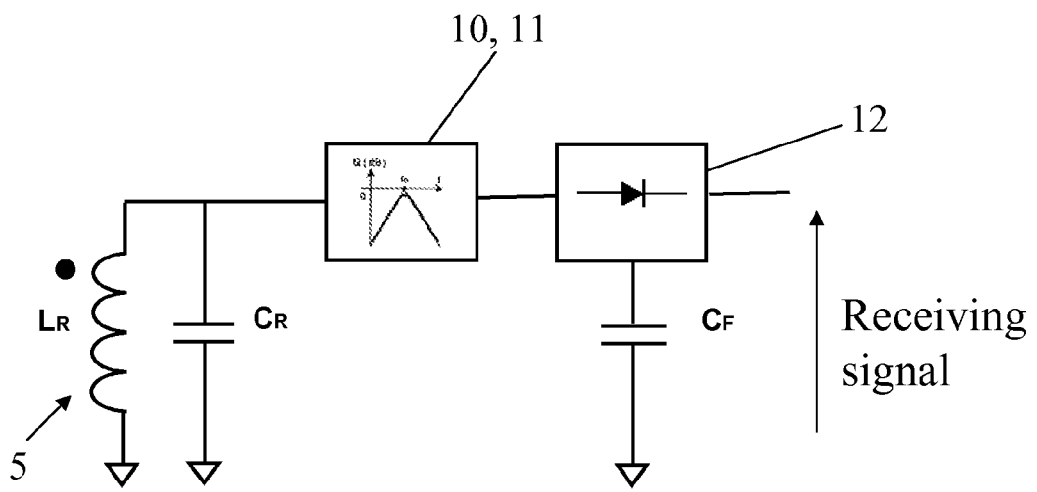

FIG. 7 illustrates diagrammatically a possible variant embodiment of the pre-processing means 6, including a filtering circuit and a demodulation circuit, the amplification not being necessarily mandatory when a capacitor $C_R$ is placed in parallel with the reception coil 5.

Of course, the invention is not limited to the embodiments described and shown in the accompanying drawings. Modifications remain possible, particularly from the viewpoint of the composition of the various elements or by substitution of technical equivalents, without thereby going outside of the field of protection of the invention.

The invention claimed is:

1. A device for detecting metal plate elements configured to work with or to be incorporated into a system for selection, movement, transfer and/or positioning of the metal plate elements, the device comprising:
    an emission coil supplied by suitable control means and generating a magnetic field;
    at least one reception coil disposed to generate by induction a voltage signal at terminals of the at least one reception coil as a result of the generation of the magnetic field; and
    means for processing and evaluating the voltage signal provided by the at least one reception coil to provide an informative signal indicating an absence or a presence of one or more of the metal plate elements in the vicinity of the emission and reception coils, the emission and reception coils being positioned spaced apart and with a specific mutual inclination such that the magnetic coupling between the emission and reception coils is changed by the presence of the one or more metal plate elements,
    wherein the emission coil and the at least one reception coil are both mounted in a case or a sensor head having an active detection face with a corresponding detection area, the emission and reception coils being positioned with the specific mutual inclination in relation to one another and in relation to the detection face, the emission and reception coils being arranged according to a configuration such that, seen in section along a plane containing their respective axes of symmetry, the emission and reception coils form with the active detection face approximately a right triangle, the active detection face constituting the hypotenuse, the emission and reception coils partly forming the two other sides of the triangle, the detection area being situated outside of the triangle, and
    a magnitude of change in amplitude and/or in power of a voltage signal at terminals of the at least one reception coil due to the presence of a peripheral part or of an edge of the one or more metal elements near the active detection face is recognized and used in a discrete manner by the processing and evaluating means to determine the number of the one or more metal plate elements that are present, a coupling intensity between the emission and reception coils being correspondingly reduced in accordance with the presence of an increasing number of metal plate elements in the detection area.

2. The detection device according to claim 1, wherein the emission coil and the at least one reception coil are arranged in an immediate proximity of one another such that, even in the absence of one of the metal plate elements in the detection area, a sufficient electromagnetic coupling exists between the emission coil and the at least one reception coil to provide a receiving signal having variations that are significant and usable in the presence of the one or more metal plate elements when only the peripheral part or the edge of the one or more metal plate elements is present in the detection area.

3. The detection device according to claim 1, wherein the emission coil and at least one reception coil are mounted in or on a support body in order to have an inclined positioning in relation to one another, the support body defining the active detection face.

4. The detection device according to claim 1, wherein the emission coil comprises two elementary coils that are placed side-by-side and coaxial, active in an alternating manner.

5. The detection device according to claim 1, wherein the emission coil and the at least one reception coil are housed in a sensor head that is part of a sensor having the case that contains at least a part of the control means and the processing and evaluation means.

6. The detection device according to claim 1, wherein the control means supplies the emission coil with a specific frequency signal $f_{osc}$, adapted to material constituting the one or more metal plate elements to be detected.

7. The detection device according to claim 6, wherein a capacitor of capacitance $C_R$ is mounted in parallel with the at least one reception coil of inductance $L_R$, $C_R$ and $L_R$ being such that:
    $L_R \times C_R \times (2 \times \Pi \times f_{osc})^2 = 1$.

8. The detection device according to claim 1, wherein the processing and evaluation
    means comprises
    means for band-pass type filtering,
    means for demodulating the filtered signal, means for analog/digital converting that processes an amplitude of the demodulated signal.

9. The detection device according to claim 1, wherein the processing and evaluation means comprises a circuit configured to deliver a pace or timing signal to the control means of the emission coil to synchronize an excitation of the emission coil with an acquisition of a receiving signal.

10. The detection device according to claim 1, wherein a ferrite-forming part is associated with the emitting coil and/or with the at least one receiving coil.

11. The detection device according to claim 2, wherein the emission coil and at least one reception coil are mounted in or on a support body in order to have an inclined positioning in relation to one another, the support body defining the active detection face.

12. The detection device according to claim 8, wherein the processing and evaluation means comprises means for amplifying the AC voltage recovered at the terminals of the at least one reception coil.

13. The detection device according to claim 8, wherein the analog/digital converting means compares a value of the demodulated and converted signal with a predefined, pre-entered or communicated reference value corresponding to the presence of a single metal plate element in the detection area associated with the active face of the sensor.

14. The detection device according to claim 1, wherein the magnitude of the change in the amplitude and/or in the power of the voltage signal is recognized and used in the discrete manner by the processing and evaluating means to selectively determine whether one metal plate element is present and whether two or more metal plate elements are present.

15. A system for selecting and transferring metal plate elements stacked in piles, the system comprising:
- at least one manipulating element;
- a detection device configured to detect the metal plate elements configured to work with or to be incorporated into the system, the device comprising:
  - an emission coil supplied by suitable control means and generating a magnetic field;
  - at least one reception coil disposed to generate by induction a voltage signal at terminals of the at least one reception coil as a result of the generation of the magnetic field; and
  - means for processing and evaluating the voltage signal provided by the at least one reception coil to provide an informative signal indicating an absence or a presence of one or more of the metal plate elements in the vicinity of the emission and reception coils, the emission and reception coils being positioned spaced apart and with a specific mutual inclination such that the magnetic coupling between the emission and reception coils is changed by the presence of the one or more metal plate elements, wherein the emission coil and the at least one reception coil are both mounted in a case or a sensor head having an active detection face with a corresponding detection area, the emission and reception coils being positioned with the specific mutual inclination in relation to one another and in relation to the detection face, the emission and reception coils being arranged according to a configuration such that, seen in section along a plane containing their respective axes of symmetry, the emission and reception coils form with the active detection face approximately a right triangle, the active detection face constituting the hypotenuse, the emission and reception coils partly forming the two other sides of the triangle, the detection area being situated outside of the triangle, a magnitude of change in amplitude and/or in power of a voltage signal at terminals of the at least one reception coil due to the presence of a peripheral part or of an edge of the one or more metal elements near the active detection face recognized and used in a discrete manner by the processing and evaluation means to determine the number of the one or more metal plate elements that are present, a coupling intensity between the emission and reception coils being correspondingly reduced in accordance with the presence of an increasing number of metal plate elements in the detection area, and during movement of one of the one or more metal plate elements selected by the manipulation element, at least one of lateral edges of the one metal element is positioned in the detection area associated with the active face of the case or of the sensor head of the detection device.

16. The system according to claim 15, wherein the at least one manipulating element comprises a robot arm equipped with suction cups or with a means for magnetic seizing, selecting the metal plate elements one-by-one and moving them along a specific path.

* * * * *